United States Patent
Yamamoto et al.

(10) Patent No.: US 7,875,145 B2
(45) Date of Patent: Jan. 25, 2011

(54) METHOD AND APPARATUS FOR JOINING ADHESIVE TAPE

(75) Inventors: Masayuki Yamamoto, Ibaraki (JP); Naoki Ishii, Kameyama (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 12/569,625

(22) Filed: Sep. 29, 2009

(65) Prior Publication Data
US 2010/0078114 A1   Apr. 1, 2010

(30) Foreign Application Priority Data
Sep. 30, 2008   (JP)  ............... 2008-253865

(51) Int. Cl.
*B32B 37/10*   (2006.01)
(52) U.S. Cl. .............. 156/256; 156/64; 156/358; 156/378; 156/523; 73/40.7; 73/104
(58) Field of Classification Search .............. 156/64, 156/358, 378, 256, 523; 73/40.7, 104
See application file for complete search history.

(56) References Cited

U.S. PATENT DOCUMENTS 6,609,414 B2 * 8/2003 Mayer et al. ............... 73/40.7
7,430,950 B2    10/2008 Yamamoto
2009/0143497 A1 * 6/2009 Choi et al. ............... 522/170

FOREIGN PATENT DOCUMENTS

| JP | 402262352 | * | 10/1990 |
| JP | 2005-159243 A | | 6/2005 |
| KR | 787721 B1 | * | 12/2007 |

* cited by examiner

*Primary Examiner*—Linda L Gray
(74) *Attorney, Agent, or Firm*—Cheng Law Group, PLLC

(57) ABSTRACT

An adhesive tape is supplied to a back face side of a ring frame, joined to the ring frame with a joining roller, and cut by pivoting a cutter blade along the ring frame. Subsequently, an inspection ring of an inspecting mechanism perform suction on the adhesive tape while contacting the adhesive tape adjacent an inner periphery of the ring frame. Separation of the adhesive tape from the ring frame is determined based on variations of the suction pressure. When the separation of the adhesive tape from the ring frame is detected, the adhesive tape is joined again with the joining roller provided in the cutter mechanism.

12 Claims, 8 Drawing Sheets

METHOD AND APPARATUS FOR JOINING ADHESIVE TAPE

BACKGROUND OF THE INVENTION

1. Field of the Invention

This invention relates to an adhesive tape joining method and an adhesive tape joining apparatus in which the adhesive tape is joined to only a ring frame that is used in processes of manufacturing chips from a semiconductor wafer or joined over the ring frame and the semiconductor wafer.

2. Description of the Related Art

As shown in FIG. 5, a semiconductor wafer (hereinafter, appropriately referred to as a "wafer") W has a surface with a circuit pattern formed thereon, and a protective tape PT is joined to the surface of the wafer so as to perform back grinding. An adhesive tape DT joined to a back face of a ring frame f is joined to the wafer W. The wafer W held in this state is transported as a mount frame MF. Various processes are performed on the wafer W in subsequent steps.

The following method is known for joining an adhesive tape to a ring frame.

An adhesive tape is supplied to a back face side of a ring frame. A joining roller that pivots around a center of the ring frame then presses the adhesive tape, thereby joining the adhesive tape to a back face of the ring frame. Subsequently, a cutter blade in a circular plate shape pivots about the center of the ring frame to cut out the adhesive tape along the ring frame. See JP2005-159243A.

The circular adhesive tape joined to the back face of the ring frame may partially be separated in a periphery direction depending on its joined condition. Some wrinkles may also occur in the adhesive tape, which may cause the adhesive tape to partially float from the back face of the ring frame. When the adhesive tape having such partial separation is joined to the wafer, the wafer tends to be in an unstable position. As a result, in a subsequent process of cutting a wafer for every chip, such a problem may arise that the cut chips are scattered.

SUMMARY OF THE INVENTION

This invention provides a method and apparatus for joining an adhesive tape to a back face of a ring frame with high accuracy and joining the adhesive tape to a semiconductor wafer so as to hold the wafer with sufficient stability.

This invention discloses an adhesive tape joining method for joining the adhesive tape that holds a semiconductor wafer to a ring frame. The adhesive tape joining method includes the steps of supplying the adhesive tape to a back face side of the ring frame, joining the supplied adhesive tape to a back face of the ring frame, cutting the joined adhesive tape along the ring frame, and inspecting separation in the adhesive tape from the ring frame.

According to the adhesive tape joining method, the supplied adhesive tape is joined to the ring frame, and then cut along the ring frame. Subsequently, presence or absence of separation is inspected around the periphery of the joined adhesive tape.

When it is determined that the adhesive tape has "no separation", then the adhesive tape joining method can proceed to the next process. When it is determined that the adhesive tape has "separation", joining of the adhesive tape may be again performed or the wafer may be transferred as defective. As a result, the wafer with no separation in the adhesive tape from the ring frame can be transferred to the next dicing process, thereby preventing the chips from scattering during the dicing process.

In the inspection step of the adhesive tape joining method, for example, the adhesive tape is sucked from the annular groove formed in the inspection ring while being in contact with the inspection ring along an inner periphery of the ring frame to reduce pressure, or gas is supplied to the adhesive tape to apply pressure. Separation of the adhesive tape from the ring frame may be inspected based on the measured pressure value and a predetermined reference value.

According to this method, when the adhesive tape is joined to the entire periphery of the ring frame and is sucked with the inspection ring, negative suction pressure increases due to suction of the adhesive tape over the entire periphery of the annular groove. When a portion of the adhesive tape is separated or floats from the ring frame, air is sucked into the separated portion of the adhesive tape to reduce negative suction pressure. Thus, the measured negative suction pressure falls below the predetermined reference value. In this case, it may be determined that the adhesive tape has "separation" from the ring frame.

When the adhesive tape is joined closely over the entire periphery of the ring frame and is pressed with the inspection ring, lower pressure than the adhesive strength of the adhesive tape is applied to the adhesive tape over the entire periphery of the annular groove to increase internal pressure of the annular groove. When a portion of the adhesive tape is separated or floats from the ring frame, gas escapes from the separated portion of the adhesive tape to reduce internal pressure of the annular groove. Thus, the measured internal pressure falls below the predetermined reference value. In this case, it may be determined that the adhesive tape has "separation" from the ring frame.

In this method, when the separation of the adhesive tape from the ring frame is detected in the inspection step, a tape joining process is preferably performed again.

With this method, even when separation occurs in a portion of the adhesive tape, performing the tape joining process again allows only a non-defective semiconductor wafer to be supplied to the next process. Consequently, more useful processes may be performed continuously comparing the case where the ring frame with the adhesive tape having separation joined thereto is eliminated as defective.

The tape joining process may be performed again with the joining roller that rolls along the pivot path of the cutter blade for cutting the adhesive tape along the ring frame.

In the inspection step of the adhesive tape joining method, for example, the sensor moves along the ring frame to measure a distance to the adhesive tape. Separation of the adhesive tape may be detected in comparison of the measured result and the predetermined reference value.

More specifically, inspection may be conducted with the sensor arranged behind the cutter blade for cutting the adhesive tape along the ring frame, following cutting of the adhesive tape.

This invention also discloses an adhesive tape joining apparatus for joining the adhesive tape that holds a semiconductor wafer to a ring frame. The adhesive tape joining apparatus includes a tape supplying device to supply the stripe adhesive tape to a back face side of the ring frame, a tape joining device to join the supplied adhesive tape to a back face of the ring frame while pressing the adhesive tape with a joining roller, a cutter mechanism to cut the joined adhesive tape along the ring frame, and an inspecting mechanism to inspect occurrence of separation in the adhesive tape from the ring frame.

The above method of this invention may be suitably implemented with the adhesive tape joining apparatus. In the adhesive tape joining apparatus, the inspecting mechanism can be configured as follows.

One embodiment of the inspecting mechanism includes an inspection ring to contact an adhesive face of the adhesive tape adjacent an inner periphery of the ring frame and to move away from the adhesive face, a suction device to perform suction on the annular groove formed at a tip end of the inspection ring, a sensor to measure pressure variations in performing the suction of the adhesive tape, and an arithmetic processing section to determine separation of the adhesive tape from the ring frame based on measurement results.

Another embodiment of the inspection mechanism includes an inspection ring to contact an adhesive face of the adhesive tape adjacent an inner periphery of the ring frame and to move away from the adhesive face, a pressing device to press the adhesive tape by supplying gas from the annular groove formed at a tip end of the inspection ring, a sensor to measure pressure variations in pressing the adhesive tape, and an arithmetic processing section to determine separation of the adhesive tape from the ring frame based on measurement results.

In the above configuration, a separation inspecting mechanism may be provided in a chuck table capable of moving vertically that supplies the adhesive tape joined to the ring frame to the wafer.

According to this configuration, the inspecting mechanism can move vertically using a vertically driving device for the chuck table, thereby simplifying the structure of the apparatus due to common use of the driving device.

The cutter mechanism of the adhesive tape joining apparatus preferably includes a cutter blade to pierce the adhesive tape joined to the ring frame and pivot along the ring frame, a joining roller to roll on a joining surface of the adhesive tape on the ring frame, and a controller to roll the joining roller when the arithmetic processing section determines that the adhesive tape has separation from the ring frame.

With this configuration, when the separation of the adhesive tape from the ring frame is detected, joining of the adhesive tape may again be performed during the adhesive tape joining step. As a result, working efficiency may be improved.

Moreover, the cutter mechanism preferably includes a sensor as the inspecting mechanism following the cutter blade that cuts the adhesive tape while pivoting along the ring frame to measure a distance to the cut adhesive tape, and the controller detects the separation of the adhesive tape from the ring frame in comparison of the measurement result by the sensor and the predetermined reference value.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DESCRIPTION OF THE PREFERRED EMBODIMENTS

Figure 1:
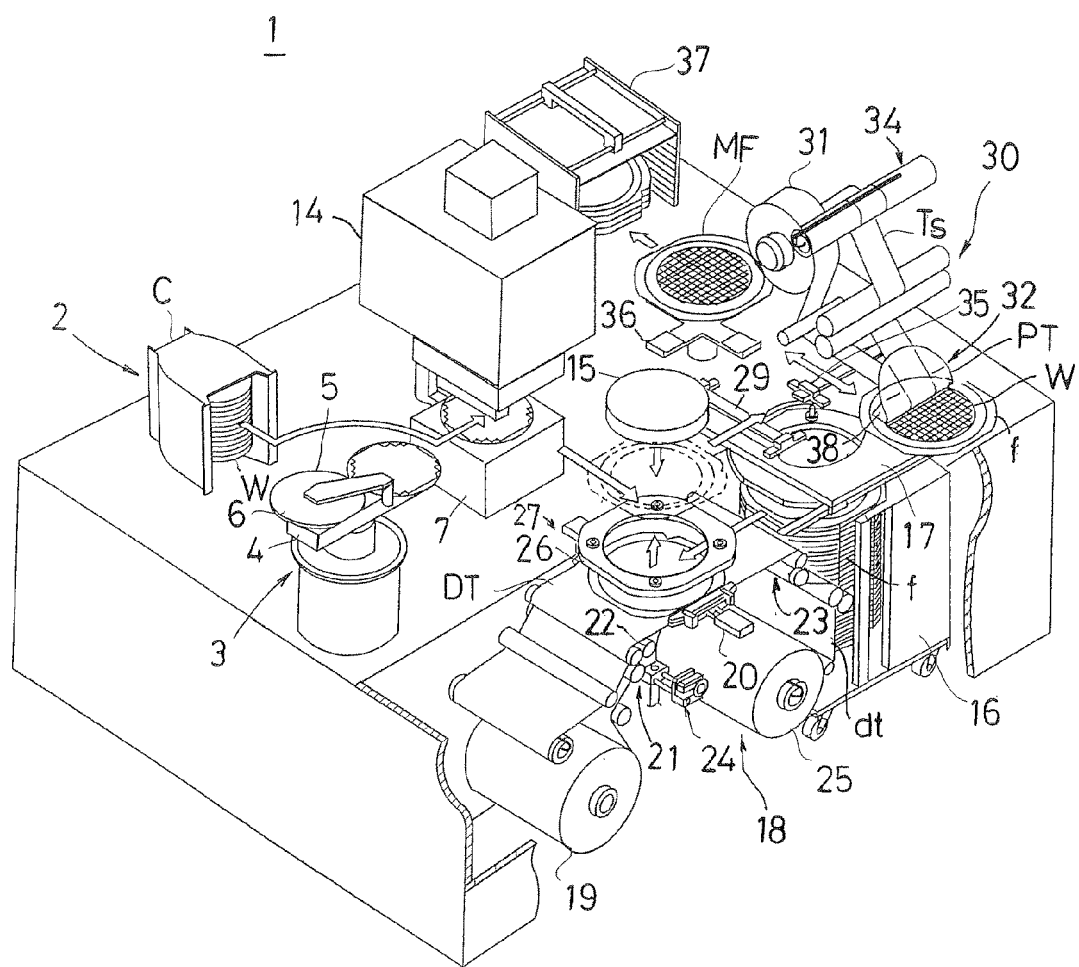
FIG. 1 is an overall perspective view of a semiconductor wafer mounting device.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. Like reference numerals in the drawings denote like elements.

One exemplary embodiment of a semiconductor wafer mounting apparatus including an adhesive tape joining apparatus of this invention will be described in detail hereinafter with reference to the drawings.

FIG. 1 shows a whole configuration of a semiconductor wafer mounting apparatus.

The semiconductor wafer mounting device 1 includes a wafer supplying section 2 with cassettes C placed therein to house a semiconductor wafer (hereinafter, simply referred to as a "wafer W") to which a back grinding process has been performed in a stack manner, a wafer transport mechanism 3 with a robot arm 4 and a pressing mechanism 5, an alignment stage 7 to perform alignment of the wafer W, an ultraviolet irradiation unit 14 to irradiate the wafer W mounted on the alignment stage 7 with ultraviolet rays, a chuck table 15 to suction-hold the wafer W, a ring frame supplying section 16 in which a ring frame f is housed in a stack manner, a ring frame transport mechanism 17 to move and mount the ring frame f onto an adhesive tape DT as a dicing tape, a tape processing section 18 to join the adhesive tape DT to a back face of the ring frame f, a ring frame vertically moving mechanism 26 to move vertically the ring frame f with the adhesive tape DT joined thereto, a mount frame manufacturing section 27 to manufacture a mount frame MF produced in one piece by joining the wafer W to the ring frame f with the adhesive tape DT joined thereto, a first mount frame transport mechanism 29 to transport the manufactured mount frame MF, a separating mechanism 30 to separate a protective tape PT joined on a surface of the wafer W, a second mount frame transport mechanism 35 to transport the mount frame MF with the protective tape PT separated therefrom with the separation mechanism 30, a turntable 36 to turn and transfer the mount frame MF, and a mount frame collecting section 37 to collect the mount frame MF in a stack manner.

The wafer supplying section 2 includes a cassette table not shown. The wafer W has a pattern surface (hereinafter appropriately referred to as a "surface") with the protective tape PT joined thereto. The cassette C with the wafers W housed therein in a stack manner is placed on the cassette table. Here, each of the wafers W is kept in a horizontal attitude with the pattern surface thereof directed upward.

The wafer transport mechanism 3 turns and moves vertically with a drive mechanism not shown. Specifically, the wafer transport mechanism 3 performs positioning of a wafer holder of the robot arm 4 and a pressure plate 6 provided in the pressing mechanism 5, mentioned later, and transfers the wafer W from the cassette C to the alignment stage 7.

The robot arm 4 of the wafer transport mechanism 3 has at its tip end the wafer holder in a horseshoe shape, not shown. The robot arm 4 is configured so as the wafer holder moves forward and backward between the wafers W housed in the cassette C in a stack manner. Here, the wafer holder at the tip end of the robot arm has a suction hole to perform vacuum suction on the back face of the wafer W.

The pressing mechanism 5 of the wafer transport mechanism 3 has at its end the circular pressure plate 6 of an approximately similar shape to the wafer W. The robot arm moves forward and backward so as the pressure plate 6 moves above the wafer W placed on the alignment stage 7.

The pressing mechanism 5 operates in poor suction of the wafer W when placing the wafer W on the holding table of the alignment stage 7 mentioned later. Specifically, when the wafer W cannot be suction-held due to warping thereof, the pressure plate 6 presses the surface of the wafer W to correct the warping, allowing the wafer to be planar. The holding table performs vacuum suction on the back face of the wafer W under this state.

The alignment stage 7 performs alignment of the placed wafer W based on an orientation mark or a notch formed at an outer periphery of the wafer W. The alignment stage 7 includes the holding table to cover the entire back face of the wafer W for performing vacuum suction.

The alignment stage 7 measures a pressure value when performing vacuum suction on the wafer W, and compares the measured pressure value with a predetermined reference value in relation to a pressure value in a normal operation (when the holding table normally performs suction on the wafer W). When the pressure value is higher than the reference value, it is determined that the holding table fails to perform suction on the wafer W due to warping of the wafer W. Subsequently, the pressure plate 6 operates to press the wafer W and correct the warping, allowing the holding table to perform suction on the wafer W normally.

The alignment stage 7 may move so as to transport the wafer in a suction-held state from an initial position where the wafer W is placed to perform alignment thereof to an intermediate position between the chuck tables 15 and the ring frame vertically moving mechanism 26 above the tape processing section 18 mentioned later. In other words, the alignment stage 7 transports the wafer W to the next process with the warping thereof being corrected to be planar.

An ultraviolet irradiation unit 14 is provided above the alignment stage 7 in the initial position. The ultraviolet irradiation unit 14 irradiates the protective-tape PT, i.e., an ultraviolet curable adhesive tape joined to the surface of the wafer W, with ultraviolet rays, thereby reducing an adhesive strength of the protective tape PT.

The chuck table 15 has a circular shape approximately similar to the wafer W so as to cover the surface of the wafer W for performing vacuum suction. The chuck table 15 moves vertically with the drive mechanism not shown from a standby position above the tape processing section 18 to a position of joining the wafer W to the ring frame f.

The chuck table 15 is received in an opening of the ring frame vertically moving mechanism 26, mentioned later, to suction-hold the ring frame f with the adhesive tape DT joined to the back face thereof, and the wafer W moves downward to a position adjacent the adhesive tape DT joined to the underside of the ring frame f.

Figure 2:
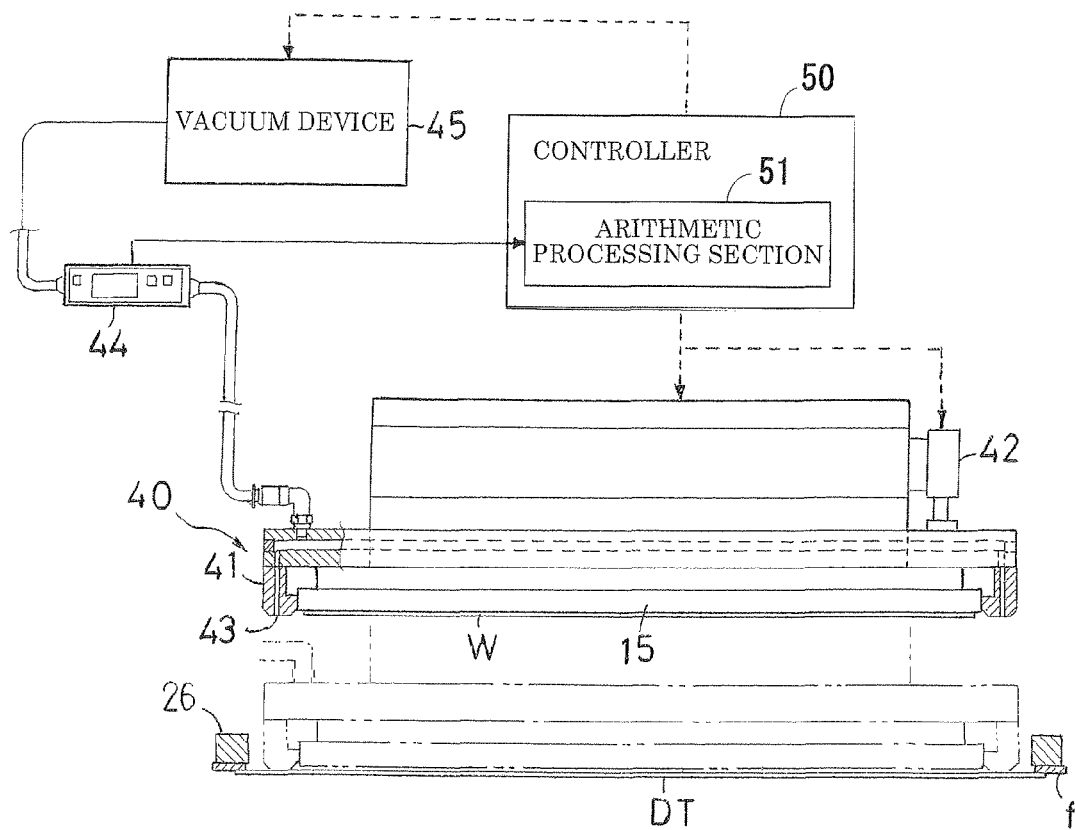
FIG. 2 is a partially cut-way front view of a chuck table and an inspecting mechanism.

As shown in FIG. 2, the chuck table 15 also includes the inspecting mechanism 40 to inspect whether or not a portion of the adhesive tape DT joined to the ring frame f is separated from the underside of the ring frame f.

The inspecting mechanism 40 has an inspection ring 41 to move vertically relative to the chuck table 15, and a cylinder 42 as a drive mechanism to move the inspection ring 41 vertically within a fixed range.

Figure 3:
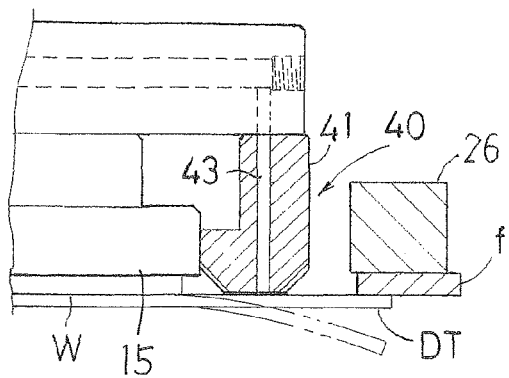
FIG. 3 is an enlarged sectional view of a main portion of the inspecting mechanism.
Figure 4:
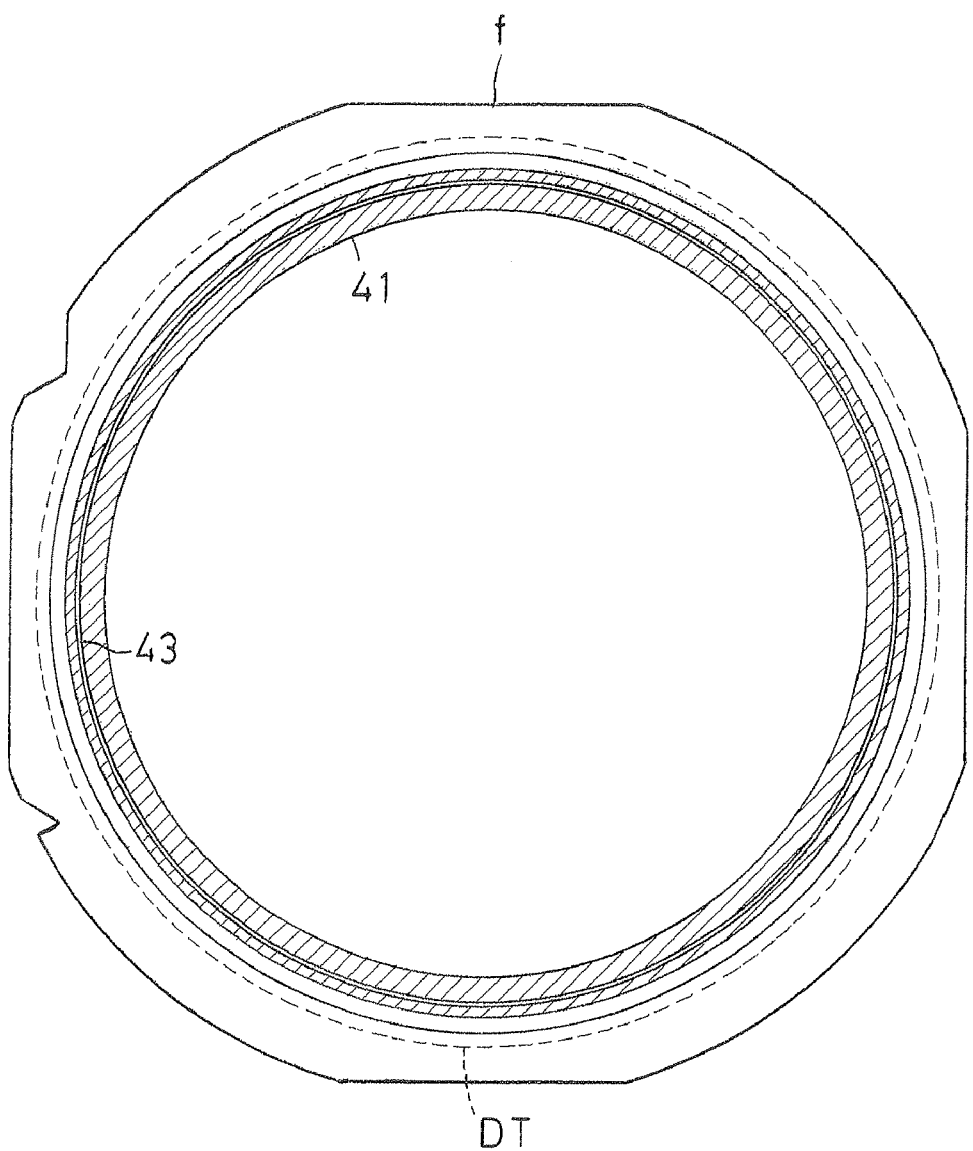
FIG. 4 is a cross-sectional top view of the main portion of the inspecting mechanism.
Figure 5:
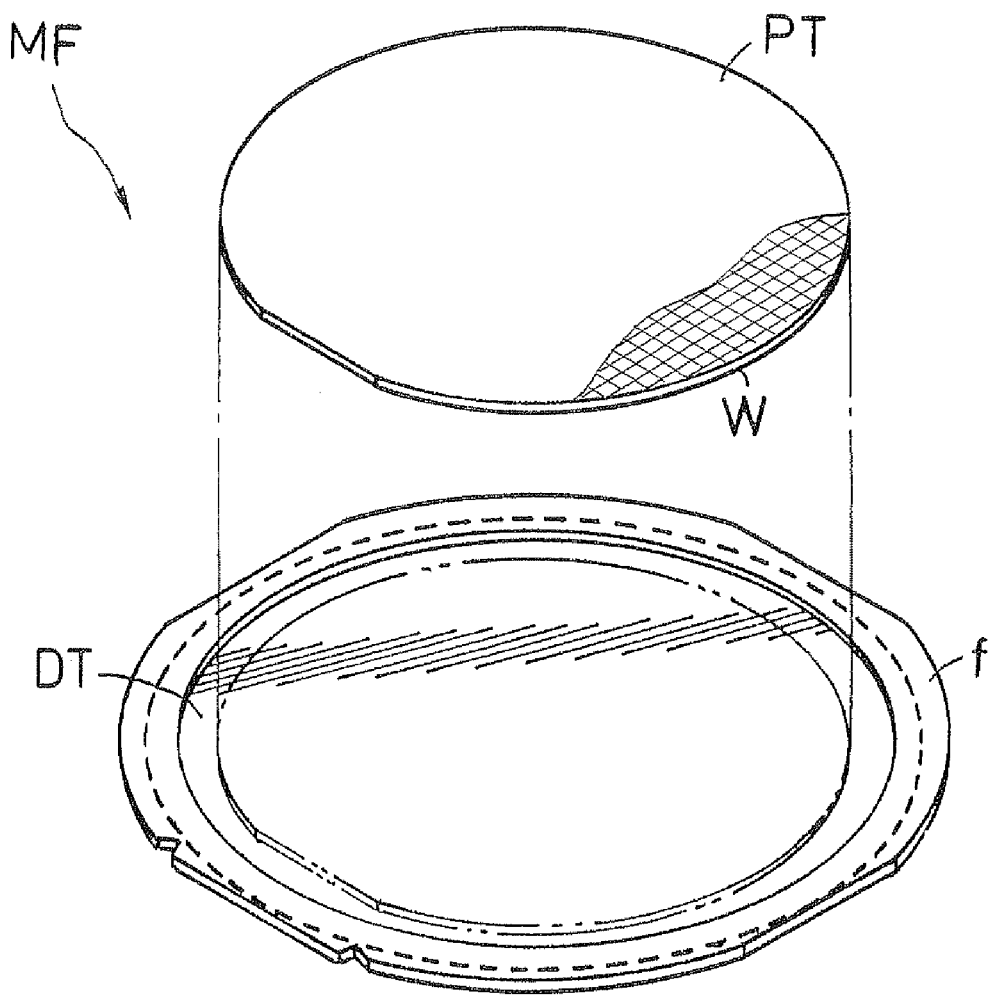
FIG. 5 is a perspective view of a mount frame.

The inspection ring 41 may itself be made of fluoroplastic, or the surface of the inspection ring 41 may be subjected to a release treatment by coating with fluorine compounds. As shown in FIGS. 2 to 4, the inspection ring 41 has an annular groove 43. A vacuum device 45 is in communication with a negative pressure sensor 44 via the annular groove 43. Here, the vacuum device 45 corresponds to the suction device of this invention.

Now referring again to FIG. 1, the body of the device houses the wagon-like ring frame supply unit 16 with pulleys on the bottom. The ring frame supply unit 16 slides and moves upward the ring frame f housed in a stack manner in the ring frame supply unit 16 having an opening on the upper side.

The ring frame transport mechanism 17 performs vacuum suction on every one ring frame f housed in the ring frame supply unit 16 in turn from the top, and transports the ring frame f to the alignment stage not shown and the position of joining the adhesive tape DT, in turn. The ring frame transport mechanism 17 serves as a holding mechanism to hold the ring frame f in the position of joining the adhesive tape DT when joining the adhesive tape DT.

The tape processing section 18 includes a tape supply unit 19 to supply the adhesive tape DT, a tension mechanism 20 to apply tension to the adhesive tape DT, a joining unit 21 to join the adhesive tape DT to the ring frame f, a cutter mechanism 24 to cut the adhesive tape DT joined to the ring frame f, a separating unit 23 to separate an unnecessary tape dt cut with the cutter mechanism 24 from the ring frame f, and a tape collecting section 25 to collect a remainder of the cut unnecessary tape dt.

The tension mechanism 20 sandwiches the adhesive tape DT on opposite ends in a width-direction to apply tension to the adhesive tape DT in a tape width direction. When a soft adhesive tape DT is used, tension applied to a tape supply direction may cause occurrence of a longitudinal wrinkle on the surface of the adhesive tape DT along the tape supply direction. In order to avoid the longitudinal wrinkle so as to join the adhesive tape DT uniformly to the ring frame f, the tension mechanism 20 applies tension on the opposite ends in the tape width direction.

The joining unit 21 is placed obliquely downwardly from the ring frame f, i.e., in the standby position. The joining unit 21 has a joining roller 22 wider that the ring frame f. Consequently, when the ring frame transport mechanism 17 holds the ring frame f transported into the joining position, the tape supply unit 19 starts to supply the adhesive tape DT. Simultaneously, the joining roller 22 moves to a joining start position (a) in the tape supply direction, which is shown on the right side in FIG. 6.

Figure 7:
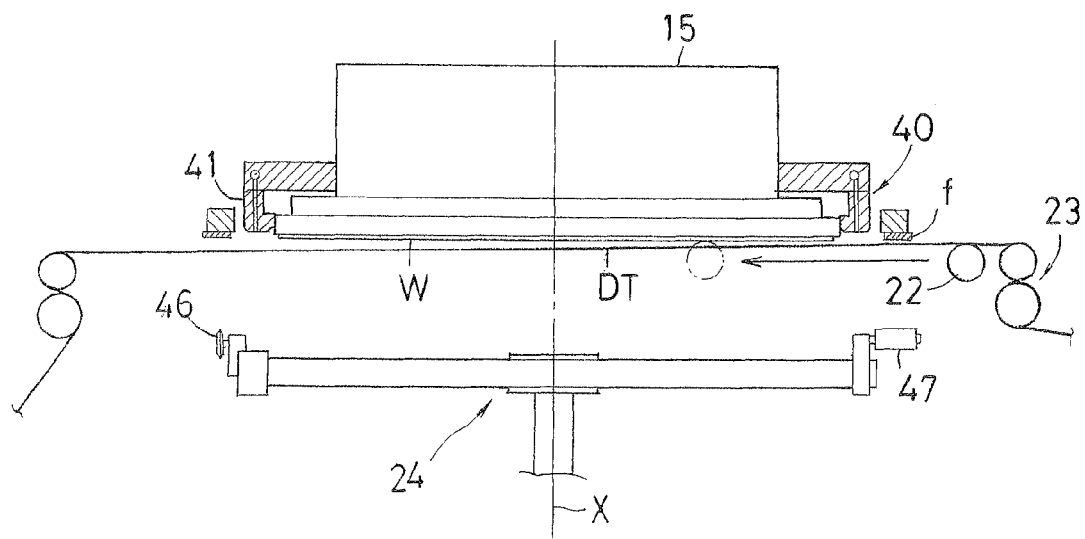

When reaching the joining start position (a), the joining roller 22 moves upward to press and join the adhesive tape DT onto the ring frame f. Subsequently, the joining roller 22 rolls from the joining start position toward the standby position, as shown in FIG. 7, to join the adhesive tape DT to the ring frame f while pressing. Here, the joining unit 21 corresponds to the tape joining device of this invention.

Figure 11:
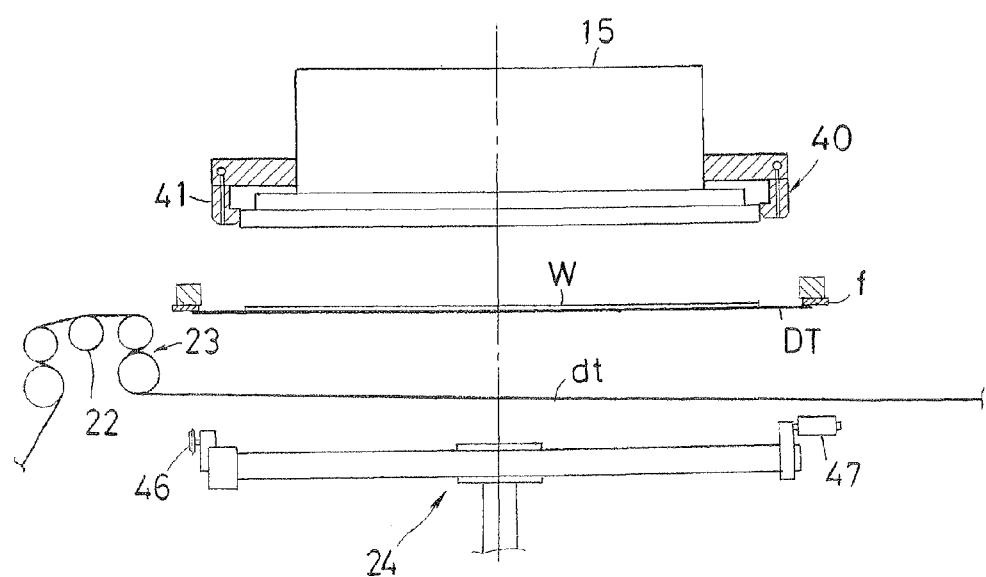

The separation unit 23 separates the unnecessary portion of the adhesive tape DT cut with the cutter mechanism 24 mentioned later from the ring frame f. Specifically, after joining the adhesive tape DT to the ring frame f and cutting the adhesive tape DT, the tension mechanism 20 releases holding of the adhesive tape DT. Subsequently, as shown in FIG. 11, the separation unit 23 moves toward the tape supply unit 31, thereby separating the cut unnecessary adhesive tape dt.

Figure 6:
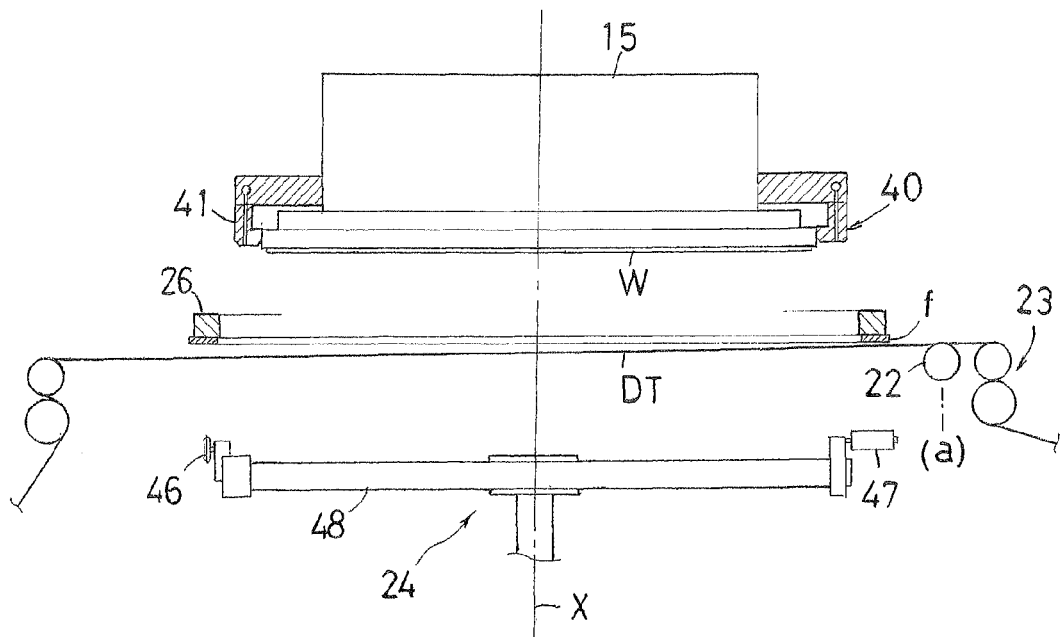
FIGS. 6 to 11 are front views each showing a tape joining step.

As shown in FIG. 6, the cutter mechanism 24 capable of moving vertically is placed below the adhesive tape DT joined to the ring frame f. The cutter mechanism 24 includes a disk-like cutter blade 46 and a narrow joining roller 47. The cutter blade 46 may move vertically to press against an underside of the ring frame f in a position outside the internal diameter of the ring frame f. The joining roller 47 presses against the underside of the ring frame f. The cutter blade 46 and joining roller 47 are arranged on the opposite ends of an arm-like rotating member 48 to rotate about a vertical axis X through a center of the ring frame f so that the cutter blade 46 and joining roller 47 directed upward can move and swing up and down, respectively.

In this embodiment, a length of the joining roller 47 is larger than a width of the ring frame f.

Consequently, when the joining unit 21 joins the adhesive tape DT to the underside of the ring frame f, the tension mechanism 20 releases holding of the adhesive tape DT, and the cutter mechanism moves upward. The cutter blade 46 and joining roller 47 of the cutter mechanism 24 after moving upward rotate about the vertical axis X to cut the adhesive tape DT in a circle shape while pressing a circumference of the cut section in the adhesive tape DT against the underside of the ring frame with the joining roller 47.

Now referring again to FIG. 1, the ring frame vertically moving mechanism 26 is usually in the standby position above a position of joining the adhesive tape DT to the ring frame f. After joining of the adhesive tape DT to the ring frame f, the ring frame vertically moving mechanism 26 moves downward to suction-hold the ring frame f. At this time, the ring frame transport mechanism 17 holding the ring frame f returns to its initial position above the ring frame supply unit 16.

The first mount frame transport mechanism 29 performs vacuum suction on the mount frame MF that the ring frame f is formed in one piece with the wafer W, and moves to mount it onto the separation table of the separation mechanism 30 not shown.

The separating mechanism 30 includes a separation table not shown to move the wafer W mounted thereon, a tape supply unit 31 to supply a separation tape Ts, a separating unit 32 to join and separate the separation tape Ts, and tape collecting section 34 to collect the separated separation tape Ts and the protective tape PT.

The tape supplying unit 31 guides and supplies the separation tape Ts fed out from the original master roll to an edge-like joining member 38 provided on a lower side of the separation unit 32.

The tape collecting section 34 guides upward the separation tape Ts fed out from the lower side of the separation unit 32 so as to wind up and collect them.

The second mount frame transport mechanism 35 performs vacuum suction on the mount frame MF fed out from the separating mechanism 30, and moves to mount it onto a turntable 36.

The turntable 36 aligns the mount frame MF, and houses it in the mount frame collecting section 37. Specifically, the second mount frames transport mechanism 35 places the mount frame MF on the turntable 36, and then aligns the mount frame MF based on an orientation mark of the wafer W or a positioning contour of the ring frame f. The turntable 36 turns so as to change a direction in which the mount frame MF is housed in the mount frame collecting section 37. When the direction for housing the mount frame is fixed, the turntable 36 presses out the mount frame MF with a pusher not shown to house the mount frame MF in the mount frame collecting section.

The mount frame collecting section 37 is placed on the mount table not shown capable of moving vertically. Specifically, moving vertically of the mount table allows the mount frame f pressed out with the pusher to be housed on any sections in the mount frame collecting section 37.

Figure 12:
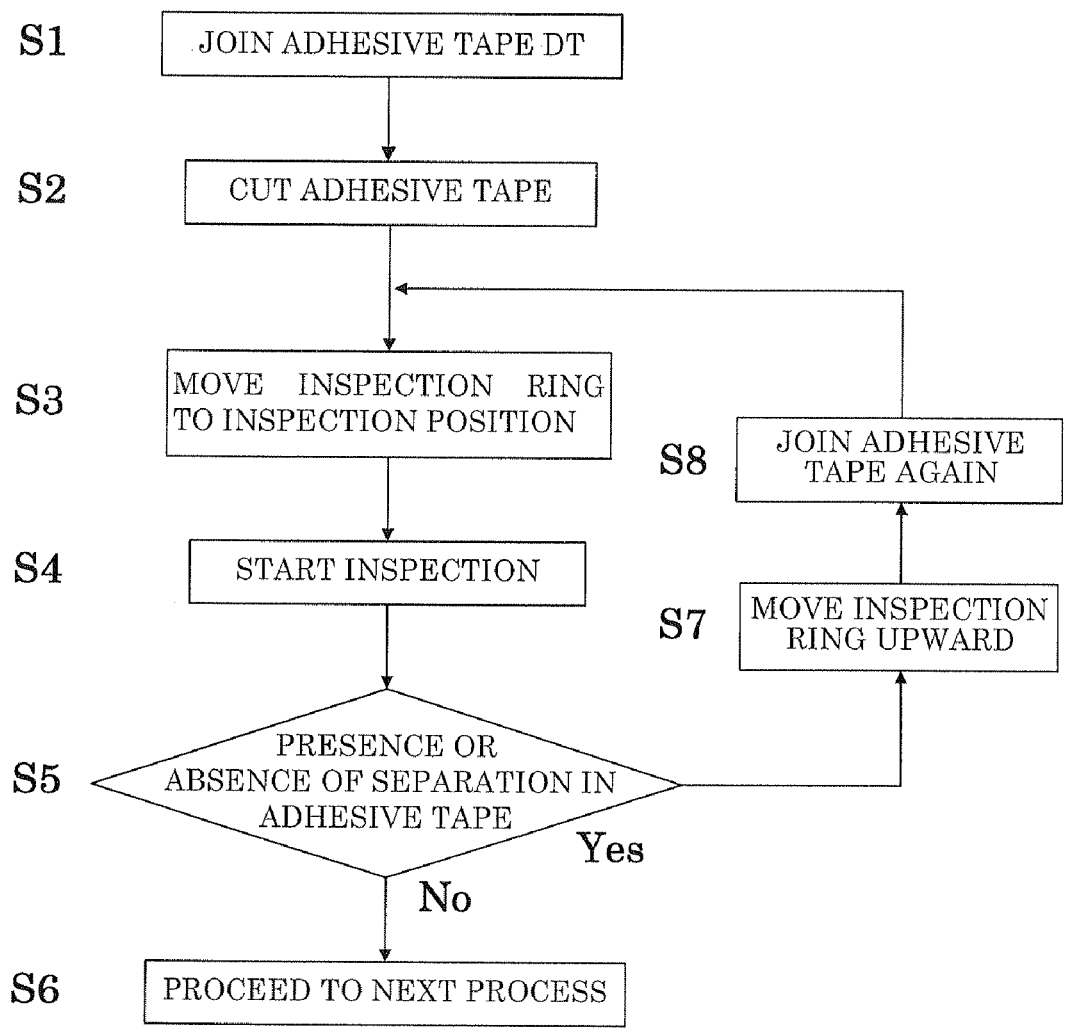
FIG. 12 is a flow chart of the tape joining process.

Description will be made hereinafter of a round of operation about the above-mentioned apparatus according to one embodiment with reference to FIGS. 6 to 11 as well as a flowchart of FIG. 12.

The wafer holder of the robot arm 4 is inserted between the stacked wafers W in the cassette C. The wafer W is suction-held on the back face thereof, and pulled out for every one sheet. The pulled out wafer W is transported to the alignment stage 7.

The robot arm 4 places the wafer W on the holding table to suction-hold the back face of the wafer W. In this state, a pressure gauge, not shown, measures a level of suction-holding the wafer W. A comparison is made of the measurement result and the predetermined reference value in relation to a pressure value in a normal operation.

When poor suction-holding is detected from the result of the comparison, the pressure plate 6 presses a surface of the wafer W. Consequently, the wafer W in a planar state with corrected warping may be suction-held. In addition, the wafer W is aligned based on the orientation mark or the notch.

After alignment of the wafer W on the alignment stage 7, the ultraviolet irradiation unit 14 irradiates the surface of the wafer W with ultraviolet rays.

The wafer W subjected to an irradiation treatment of ultraviolet rays is transported, along with the alignment stage 7, to the mount frame manufacturing unit 27 at a next step. That is, the alignment stage 7 is moved to an intermediate position between the chuck table 15 and the ring frame vertically moving mechanism 26.

When the alignment stage 7 is set standby in a predetermined position, the chuck table 15 located above the alignment stage 7 moves downward to contact a bottom face thereof with the wafer W, thereby starting vacuum suction. When starting the vacuum suction of the chuck table 15, the chuck table 15 releases the suction holding of the wafer W on the holding table, and receives the wafer W with the warping thereof being corrected. After transporting the wafer W, the alignment stage 7 returns to its initial position.

The ring frame transport mechanism 17 performs vacuum suction on every ring frame f from the top that is housed in the ring frame supplying unit 16 in a stack manner, and then pulls it out. The pulled-out ring frame f is aligned on the alignment stage not shown, and then transported to a tape joining position above the adhesive tape DT.

The ring frame transport mechanism 17 holds the ring frame f and moves it into a joining position of the adhesive tape DT, and then a tape supplying unit 19 starts to supply the adhesive tape DT. Simultaneously, the joining roller 22 moves into the joining start position (a) shown in FIG. 6.

When the joining roller 22 reaches the joining start position (a), the tension mechanism 20 holds the opposite ends of the adhesive tape DT in the width direction, thereby applying tension to the adhesive tape DT in the tape width direction.

Next, as shown in FIG. 7, the chuck table 15 with the wafer W suction-held on the underside thereof moves downward to a position above the center of the ring frame f, and the joining roller 22 moves upward to join the adhesive tape DT to the end of ring frame f while pressing. After joining the adhesive tape DT to the end of ring frame f, the joining roller 22 rolls toward the tape supply unit 19, i.e., to a standby position. In the rolling step, the joining roller 22 rolls while pressing the non-adhesive surface (underside) of the adhesive tape DT to join the adhesive tape DT to the underside of the ring frame f and to the underside (back face) of the wafer W (STEP 1). Here, the inspection ring 41 of the inspecting mechanism 40 held by the chuck table 15 already moves upward to a retracted position.

Figure 8:
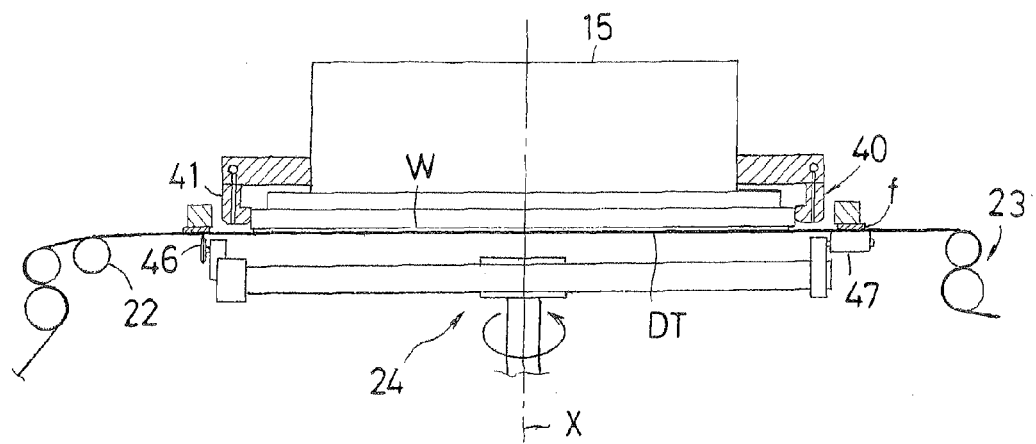

As shown in FIG. 8, when the joining roller 22 reaches its joining end position, the tension mechanism 20 releases holding of the adhesive tape DT. Simultaneously the cutter mechanism 24 moves upward and rotates about the vertical axis X with the cutter blade 46 and joining roller 47 pushed against the adhesive tape DT. In this state, the cutter blade 46 cuts the adhesive tape DT in a circle with a diameter larger than the internal diameter of the ring frame f, and presses the periphery of the cut portion of the adhesive tape DT with the joining roller 47 (STEP S2).

Figure 9:
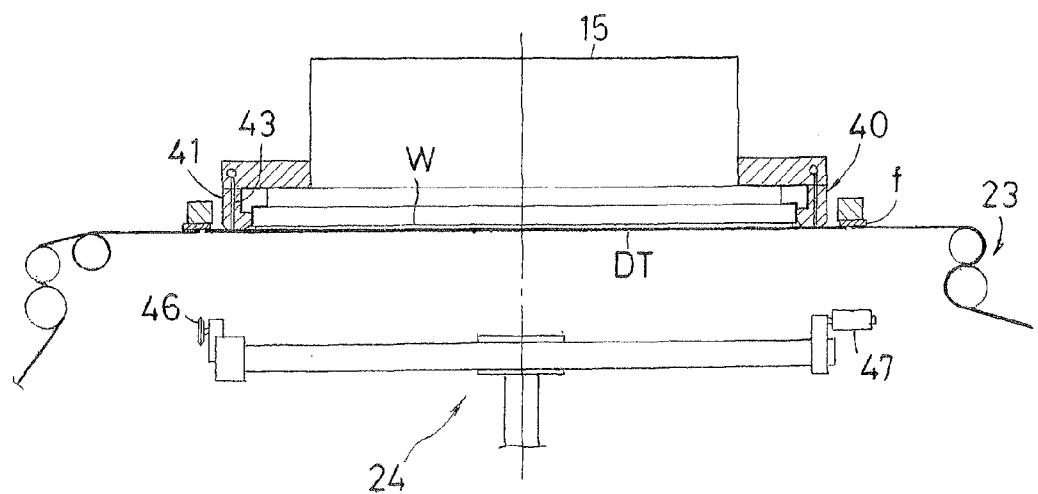
Figure 10:
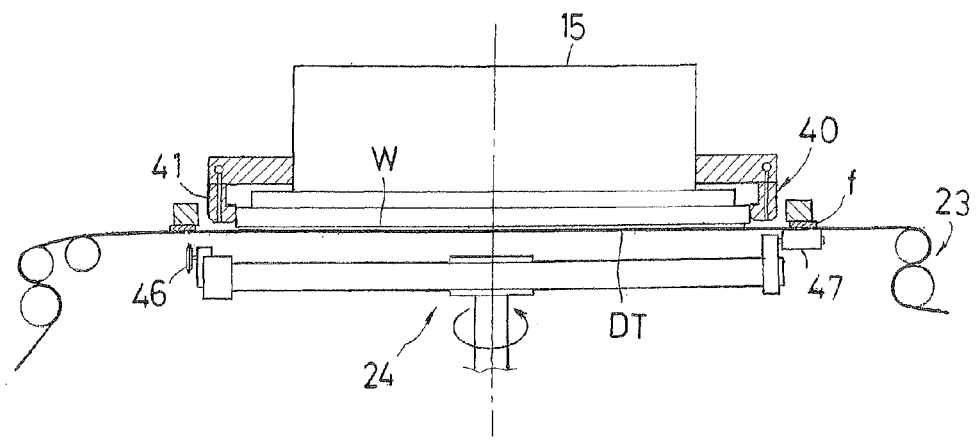

As shown in FIG. 9, next, the inspection ring 41 moves downward to a lower bound as an inspection position to bring into contact with the upper surface of the adhesive tape DT adjacent the inner circumference of the ring frame f (STEP S3). When the inspection ring 41 moves down to the inspection position, the vacuum device 45 firstly operates to start performing of suction of the inspection ring 41 from the annular groove 43 (STEP S4).

The negative pressure sensor 44 measures a negative suction pressure in this state, and transmits the measurement result to the controller 50. The arithmetic processing section 51 of the controller 50 shown in FIG. 9 converts a signal of the received measurement result into a measured value, and compares the measurement value with a predetermined reference value (STEP S5).

When the adhesive tape DT is joined closely over the perimeter of the ring frame f, the adhesive tape DT is suction-held over the perimeter of the annular groove 43, which leads to increased negative suction pressure. When the measured negative suction pressure is higher than the predetermined reference value, it is determined that the adhesive tape has "no separation." Subsequently, the step proceeds to a next process (STEP S6).

As shown in FIG. 3 in an imaginary line, when a portion of the joined adhesive tape DT is separated, air is sucked from the separation portion, which suppressing increasing of negative suction pressure. That is, the measured negative suction pressure is lower than the predetermined reference value. In this state, the controller 50 determines that the adhesive tape has "separation."

After determining that the adhesive tape has "separation", the controller 50 moves upward the inspection ring 41 while stopping suction of the vacuum device 45 to separate the wafer W from the adhesive tape DT (STEP S7). Subsequently, as shown in FIG. 10, the controller 50 again moves upward the cutter mechanism 24 lowered in the standby position and presses only the joining roller 47 against the joining portion of the adhesive tape DT. The joining roller 47 rotates a specified number of times in this state (STEP S8), which allows joining again of the adhesive tape DT to the separation.

After joining again of the adhesive tape DT, processes of STEP S3 to STEP S5 are repeated. In other words, the controller 50 moves down the inspection ring 41 to the inspection position for conducting a separating inspection again.

When it is determined that the adhesive tape has "no separation" through the suction inspection, the separation unit 23 moves toward the tape supply unit 19, as shown in FIG. 11, to separate the unnecessary tape dt remaining on the outside of the adhesive tape DT cut in a circle.

Subsequently, the tape supply unit 19 operates to feed out the adhesive tape DT while sending the unnecessary tape dt to the tape collecting section 25. In this state, the joining roller 22 moves the adhesive tape DT to a joining start position for preparing joining to the next ring frame f.

The mount frame MF that the ring frame f and the wafer W are formed in one piece may be manufactured as mentioned above.

After manufacturing of the mount frame MF, the chuck table 15 and the ring frame vertically moving mechanism 26 move upward. The holding table not shown also moves below the mount frame MF and places it. The first mount frame transport mechanism 29 suction-holds the placed mount frame MF, and moves to place the mount frame MF onto the separation table not shown to separate the protective tape from the mount frame MF.

When joining of the separation tape Ts to the end of the protective tape PT is completed, the mount frame MF moves forward and the separation tape Ts is wound up to the tape collecting section 34 at a speed synchronized to a traveling speed of the mount frame MF. Consequently, the joining member 38 joins the separation tape Ts to the protective tape PT on the surface of the wafer W while pressing. The joining member 38 also separates the protective tape PT together with the separation tape Ts from the surface of wafer W while separating the joined separation tape Ts.

When the joining member 38 reaches the rear edge of the protective tape PT and completely separates the protective tape PT from the surface of the wafer W, the joining member 38 moves upward and the separation unit 32 returns to its initial state.

After the protective tape PT is separated from the mount frame MF, the mount frame MF moves to the standby position of the second mount frame transport mechanism 35.

Subsequently, the second mount frame transport mechanism 35 moves to place the mount frame MF fed out from the separation mechanism 30 onto the turntable 36. The placed mount frame MF is aligned using the orientation mark or the notch, and a direction of the mount frame MF to be housed is adjusted. After performing alignment of the mount frame MF and determination in the direction thereof to be housed, a pusher pushes out the mount frame MF to house it in the mount frame collecting section 37.

As mentioned above, detecting of the separation in the adhesive tape DT and joining again thereof may be performed in the course of manufacturing the mount frame MF. Thus, scattering of the chip due to poor adhesion of the adhesive tape DT can be avoided or at least suppressed during the next dicing step, and working efficiency may be improved.

This invention is not limited to the foregoing embodiment, but may be modified as follows:

The foregoing illustrative embodiment performs joining of the adhesive tape DT to the ring frame f and joining of the adhesive tape DT to the wafer W simultaneously, but may be modified as under. That is, joining of the adhesive tape DT to the ring frame f, including cutting thereof, may be previously performed, and subsequently joining and inspecting separation of the adhesive tape DT to and from the wafer W may be performed in another next step.

The foregoing illustrative embodiment has the inspecting mechanism 40 in which the inspection ring 41 is provided on the chuck table 15 for joining the wafer W to the adhesive tape DT. Alternatively, the inspecting mechanism may move vertically independently from the chuck table 15.

The inspecting mechanism 40 may also be implement so as to detect separation of the adhesive tape DT due to reduction in air pressure blowing off from the annular groove 43 adjacent the adhesive tape DT. For instance, the measurement value may be predetermined as a reference value in which air blows off from the annular groove 43 with the adhesive tape DT joined closely to the ring frame f and pressure variations due to air leakage from the annular groove 43 are detected.

In the foregoing illustrative embodiment, the inspecting mechanism 40 determines separation of the adhesive tape DT due to variations of a negative suction pressure or an air pressure. Alternatively, the inspecting mechanism 40 may be configures as under. That is, such as a contact type sensor and a distance measurement sensor of an ultrasonic wave or light reflex type may detect the separation or float of the adhesive tape DT from the ring frame f.

Specifically, three arm-like rotating members 48 may be attached radially to the vertical axis X of the cutter mechanism 24 at equal intervals, one of them having a sensor. Immediately after the cutter blade 46 cuts the adhesive tape DT, the sensor measures a distance to the underside of the adhesive tape DT, following the cutter blade 46.

When using a non-contact type sensor, the sensor that turns following cutting of the adhesive tape DT measures results linearly and transmits them to the controller 50. The arithmetic processing section 51 performs comparison of the reference value determined by the arithmetic processing section 51 and the measurement value. When using a contact type sensor, the sensor pivots in synchronization with the cutter blade 46 with the tip end of the sensor adjacent the underside of the adhesive tape DT. When the tip end of the sensor brings into contact with the adhesive tape DT, the sensor transmits a signal to the controller 50 to determine that the adhesive tape has "separation."

In the foregoing illustrative embodiment, the joining roller 47 provided in the cutter mechanism 24 performs joining again of the adhesive tape DT. The joining roller 22 of the joining unit 21 may operate again to join the adhesive tape DT again. With this configuration, the inspecting mechanism 40 formed in one piece with the chuck table 15 and the joining roller 47 of the cutter mechanism 24 may be omitted.

In the foregoing illustrative embodiment, the separation of the adhesive tape DT is inspected after the adhesive tape DT is joined over the ring frame f and the wafer W. It is also possible to inspect the separation of the adhesive tape DT with the adhesive tape being joined to only the ring frame f.

In the foregoing illustrative embodiment, the joining roller 47 rolls on the underside of the adhesive tape DT following the cutter blade 46 pivoting to cut the adhesive tape DT. The joining roller 47 may be used only when joining the adhesive tape DT again.

The cutter mechanism 24 of the foregoing illustrative embodiment and modifications cuts the strip adhesive tape DT with the cutter blade 46 after joining the adhesive tape DT over the ring frame f and the wafer W. The inspecting mechanism may be applied to join the adhesive tape DT cut in advance in a corresponding shape to the ring frame f.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of joining an adhesive tape that holds a semiconductor wafer to a ring frame, comprising:
   supplying the adhesive tape to a rear face side of the ring frame;
   joining the supplied adhesive tape to a rear face of the ring frame;
   cutting the joined adhesive tape along the ring frame; and
   inspecting separation of the adhesive tape from the ring frame by performing suction of the adhesive tape from an annular groove formed in an inspection ring while contacting the inspection ring along an inner periphery of the ring frame to reduce pressure, or supplying gas to the adhesive tape to apply pressure, and inspecting separation of the adhesive tape from the ring frame based on a measured pressure value and a predetermined reference value.

2. The method of joining the adhesive tape according to Claim 1, wherein
   when the separation of the adhesive tape from the ring frame is detected in the inspecting, a tape joining process is performed again.

3. The method of joining the adhesive according to claim 2, wherein
   the tape joining process is performed again with a joining roller that rolls along a pivot path of a cutter blade for cutting the adhesive tape along the ring frame.

4. The method of joining the adhesive tape according to Claim 1, wherein
   in the inspecting, a sensor moves along the ring frame to measure a distance to the adhesive tape, and the separation of the adhesive tape is detected in comparison of a measured result and a reference value determined in advance.

5. The method of joining the adhesive tape according to claim 4, wherein
   the separation of the adhesive tape from the ring frame is detected with the sensor arranged behind a cutter blade for cutting the adhesive tape along the ring frame, following cutting of the adhesive tape.

6. An apparatus for joining an adhesive tape that holds a semiconductor wafer to a ring frame, comprising:
   a tape supplying device to supply a stripe adhesive tape to a rear face side of the ring frame;
   a tape joining device to join the supplied adhesive tape to a rear face of the ring frame while pressing the adhesive tape with a joining roller,
   a cutter mechanism to cut the joined adhesive tape along the ring frame; and
   an inspecting mechanism to inspect occurrence of separation in the adhesive tape from the ring frame,
   wherein the inspecting mechanism comprises:
   an inspection ring to contact an adhesive face of the adhesive tape adjacent an inner periphery of the ring frame and to move away from the adhesive face;
   a suction device to perform suction on an annular groove formed at a tip end of the inspection ring;
   a sensor to measure pressure variations in performing the suction of the adhesive tape; and
   an arithmetic processing section to determine separation of the adhesive tape from the ring frame based on measurement results.

7. The apparatus for joining the adhesive tape according to Claim 6, further comprising
   a separation inspecting mechanism provided in a chuck table capable of moving vertically that supplies the adhesive tape joined to the ring frame to the wafer.

8. The apparatus for joining the adhesive tape according to Claim 6, wherein
   the cutter mechanism comprises:
   a cutter blade to pierce the adhesive tape joined to the ring frame and pivot along the ring frame;

a joining roller to roll on a joining surface of the adhesive tape on the ring frame; and a controller to roll the joining roller when the arithmetic processing section determines that the adhesive tape has separation from the ring frame.

9. An apparatus for joining an adhesive tape that holds a semiconductor wafer to a ring frame, comprising:

a tape supplying device to supply a stripe adhesive tape to a rear face side of the ring frame;

a tape joining device to join the supplied adhesive tape to a rear face of the ring frame while pressing the adhesive tape with a joining roller, a cutter mechanism to cut the joined adhesive tape along the ring frame; and an inspecting mechanism to inspect occurrence of separation in the adhesive tape from the ring frame, wherein the inspection mechanism comprises:

an inspection ring to contact an adhesive face of the adhesive tape adjacent an inner periphery of the ring frame and to move away from the adhesive face;

a pressing device to press the adhesive tape by supplying gas from the annular groove formed at a tip end of the inspection ring;

a sensor to measure pressure variations in pressing the adhesive tape; and an arithmetic processing section to determine separation of the adhesive tape from the ring frame based on measurement results.

10. The apparatus for joining the adhesive tape according to claim 9, wherein a separation inspecting mechanism is provided in a chuck table capable of moving vertically that supplies the adhesive tape joined to the ring frame to the wafer.

11. The apparatus for joining the adhesive tape according to claim 9, wherein the cutter mechanism comprises:

a cutter blade to pierce the adhesive tape joined to the ring frame and pivot along the ring frame;

a joining roller to roll on a joining surface of the adhesive tape on the ring frame; and a controller to roll the joining roller when the arithmetic processing section determines that the adhesive tape has separation from the ring frame.

12. An apparatus for joining an adhesive tape that holds a semiconductor wafer to a ring frame, comprising:

a tape supplying device to supply a stripe adhesive tape to a rear face side of the ring frame;

a tape joining device to join the supplied adhesive tape to a rear face of the ring frame while pressing the adhesive tape with a joining roller, a cutter mechanism to cut the joined adhesive tape along the ring frame; and an inspecting mechanism to inspect occurrence of separation in the adhesive tape from the ring frame, wherein the cutter mechanism comprises:

a cutter blade to pierce the adhesive tape joined to the ring frame and pivot along the ring frame;

a joining roller to roll on a joining surface of the adhesive tape on the ring frame;

a sensor for inspection following the cutter blade that cuts the adhesive tape while pivoting along the ring frame to measure a distance to the cut adhesive tape, and a controller to roll the joining roller when an arithmetic processing section determines that the adhesive tape has separation from the ring frame in comparison of the measurement result and a reference value determined in advance.

* * * * *